United States Patent
Jaegeler-Hoheisel et al.

(10) Patent No.: US 9,595,692 B2
(45) Date of Patent: Mar. 14, 2017

(54) METHOD FOR PRODUCING AN ORGANIC COMPONENT AND ORGANIC COMPONENT COMPRISING AN ARRANGEMENT OF ISOLATED METAL PARTICLE NANOCLUSTERS

(71) Applicant: TECHNISCHE UNIVERSITÄT DRESDEN, Dresden (DE)

(72) Inventors: Till Jaegeler-Hoheisel, Dresden (DE); Tobias Schwab, Dresden (DE); Sylvio Schubert, Dresden (DE); Moritz Riede, Dresden (DE); Karl Leo, Dresden (DE)

(73) Assignee: Technische Universität Dresden, Dresden (DE)

( * ) Notice: Subject to any disclaimer, the term of this patent is extended or adjusted under 35 U.S.C. 154(b) by 45 days.

(21) Appl. No.: 14/652,188

(22) PCT Filed: Dec. 20, 2013

(86) PCT No.: PCT/DE2013/100435
§ 371 (c)(1),
(2) Date: Sep. 9, 2015

(87) PCT Pub. No.: WO2014/094741
PCT Pub. Date: Jun. 26, 2014

(65) Prior Publication Data
US 2016/0133875 A1    May 12, 2016

(30) Foreign Application Priority Data
Dec. 21, 2012  (DE) .................. 10 2012 113 030

(51) Int. Cl.
*H01L 21/02*   (2006.01)
*H01L 51/52*   (2006.01)
(Continued)

(52) U.S. Cl.
CPC .......... *H01L 51/5268* (2013.01); *H01L 51/44* (2013.01); *H01L 51/5012* (2013.01); *H01L 51/5092* (2013.01); *H01L 2251/5369* (2013.01)

(58) Field of Classification Search
CPC ....... H01L 21/02601; H01L 2251/5369; H01L 51/444; H01L 51/5012; H01L 51/5092; H01L 51/5268
See application file for complete search history.

(56) References Cited

U.S. PATENT DOCUMENTS

| | | |
|---|---|---|
| 6,023,128 A | 2/2000 | Grothe et al. |
| 2011/0198636 A1 | 8/2011 | Choi et al. |
| 2013/0025657 A1* | 1/2013 | Qi .................. H01G 9/2031 136/255 |

FOREIGN PATENT DOCUMENTS

| | | |
|---|---|---|
| JP | 2007 123124 A | 5/2007 |
| JP | 2012 169266 A | 9/2012 |
| WO | 2007/001429 A2 | 1/2007 |

OTHER PUBLICATIONS

Han et al., "Al:SiO Thin Films for Organic Light-Emitting Diodes," Journal of Applied Physics, 2004, 709-614.
(Continued)

*Primary Examiner* — Hoai V Pham
(74) *Attorney, Agent, or Firm* — Sutherland Asbill & Brennan LLP

(57) ABSTRACT

The invention relates to a method for producing an organic component in which a layer stack comprising an electrode, a counter-electrode and one or more organic layers is produced and in which a functional layer with metal particle nanoclusters is formed in the layer stack, wherein here in the layer stack a base layer of an inorganic material is produced on an underlying stack region which comprises at least one organic layer and an arrangement of isolated metal particle (Continued)

nanoclusters is formed on the base layer. The invention further relates to an organic component.

13 Claims, 10 Drawing Sheets

(51) Int. Cl.
*H01L 51/44* (2006.01)
*H01L 51/50* (2006.01)

(56) References Cited

OTHER PUBLICATIONS

PCT International Search Report for PCT Application No. PCT/DE2013/100435 mailed Aug. 26, 2014 (8 pages).
PCT Notification of International Preliminary Report on Patentability mailed Jul. 2, 2015 for PCT Application No. PCT/DE2013/100435 (8 pages).
German Office Action for DE Application No. 10 2012 113 030.2 mailed Jun. 27, 2016 (5 pages).

* cited by examiner

METHOD FOR PRODUCING AN ORGANIC COMPONENT AND ORGANIC COMPONENT COMPRISING AN ARRANGEMENT OF ISOLATED METAL PARTICLE NANOCLUSTERS

CROSS REFERENCE TO RELATED APPLICATIONS

This application is a U.S. national stage application of PCT/DE2013/100435, filed on Dec. 20, 2013, which claims priority to German Application No. 102012113030.2, filed on Dec. 21, 2012. The contents of these applications are hereby incorporated by reference.

BACKGROUND

This object is solved by a method for producing an organic component in which a layer stack comprising an electrode, a counter-electrode and one or more organic layers is produced and in which a functional layer with metal particle nanoclusters is formed in the layer stack, wherein here in the layer stack a base layer of an inorganic material is produced on an underlying stack region which comprises at least one organic layer, and an arrangement of isolated metal particle nanoclusters is formed on the base layer; and an organic component comprising a layer stack which comprises an electrode, a counter-electrode and one or more organic layers, wherein a functional layer comprising metal particle nanoclusters which are disposed on a base layer is disposed in the layer stack.

Electrodes having a stacked layer structure for organic electronic components are known from the document WO 2007/001429 A2.

The document DE 195 18 668 A1 discloses an electroluminescent layer system comprising a light-emitting organic material disposed between two electrodes which can be connected to a DC voltage source, where a first electrode is a hole-injecting electrode (anode) and a second electrode is an electron-injecting electrode (cathode). One or both electrodes should consist of a nanomaterial at least in some regions.

Deposition of thin layers in a vacuum environment is frequently used to produce such or other organic components. Other methods such as deposition from solution, sputtering, i.e. layer deposition with the aid of ionized carrier gas, are also used.

SUMMARY

It is the object of the invention to provide a method for producing an organic component and an organic component with which the operating properties of the organic component are optimized. In conjunction with the organic light-emitting diodes, in particular an improved coupling-out of the light produced in the component should be achieved.

This object is solved by a method for producing an organic component according to the independent claim 1 and an organic component according to the independent claim 13. Advantageous embodiments are the subject matter of dependent claims.

It can be provided to produce the layer stack for the electric organic component on a substrate.

The organic layers are produced at least in part between the electrode and the counter-electrode and in electrical contact with the electrode and the counter-electrode.

In order to form a functional layer with metal particle nanoclusters in the layer stack, a base layer is formed from an inorganic material and then an arrangement of isolated metal particle nanoclusters is produced on the base layer. In order to form the functional layer with metal particle nanoclusters in the layer stack, the base layer is produced from an inorganic material on an underlying stack region which contains at least one organic layer. An arrangement of metal particle nanoclusters which are disposed in an isolated manner is formed on the base layer.

The metal particle nanoclusters can consist of a metal or a mixture of metals (alloy).

The layer stack can comprise a light-emitting region of organic material so that the component comprises an organic light-emitting component. Alternatively the organic component can be produced as an organic solar cell.

The surface density, the distance between isolated metal particle nanoclusters and/or the particle size on the base layer can be varied by varying the process parameters over a wide range. Consequently improved properties can be achieved for the component.

The metal particle nanoclusters on the base layer can have improved properties compared with nanoclusters which would have been deposited on an underlying layer.

Size and/or distribution of the metal particle nanoclusters can depend on the roughness and/or the structuring of the layer(s) located under the base layer.

Size and/or distribution of the metal particle nanoclusters can depend on the roughness and/or the structuring of the base layer.

The metal particle nanoclusters can be produced in the immediate vicinity of functioning, intrinsic, organic semiconductor layers. Thus, a near-field coupling to the metal particle nanoclusters can possibly be achieved. The metal particle nanoclusters can be produced in the immediate vicinity of other functional layers of the layer stack, where the minimal distance is only determined by the thickness of the base layer.

A following layer in the layer arrangement can be produced on the base layer with the metal particle nanoclusters formed thereon, which layer at least partially smooths the surface contours produced by means of the metal particle nanoclusters.

Complex layer stacks can be produced whereby by means of multiple application of corresponding process steps, multiple functional layers comprising base layer and isolated metal particle nanoclusters disposed thereon are produced.

By means of using the one or the plurality of functional layers, a uniform colour perception can be achieved at various viewing angles for organic light-emitting diodes.

An improvement in the case of organic components primarily constitutes the increase in the energy conversion efficiency but, depending on the application, other properties such as low weight, attractive colouration, longevity, partial transparency, the combination of various functions possibly of solar powered lamps or processing properties can also be crucial for an improvement.

Depending on the type of organic component, the operating properties of the respective component can be influenced with the aid of the isolated metal particle nanoclusters. For example, the functional layer can serve as a scattering or coupling-out layer for the light produced in the photoactive region of an organic light-emitting diode. Another application is the coupling-in of light into the absorber layers of organic solar cells.

The base layer produced from an inorganic material which is electrically conducting, at least in very thin layers, forms the substrate for the metal particle nanoclusters to be produced subsequently thereon. The isolation of the metal particle nanoclusters means in particular that these are at a distance from one another and in this respect an arrangement of separate metal particle nanoclusters is formed. The metal particle nanoclusters can, for example, have a substantially ellipsoidal shape or a half-dome shape.

The functional layer can be produced at any point inside the layer arrangement. The function taken over by the functional layer in the organic component can also be determined by this means. In particular, this arrangement enables the metal particle nanoclusters to be introduced into the layer stack so that the function of the other organic layers is not substantially impaired. Thus, the metal particle nanoclusters can be introduced, for example, into the layer stack after the layers important for the function of the component have been executed as planar layers. What is new with the described method is that only moderate temperatures are used to produce the metal particle nanoclusters which do not destroy the organic layers. It should be stressed that the method described in the appended embodiment goes without the use of solvents directly in the production of the layer stack.

The proposed method for forming the functional layer also satisfies the frequently high requirements for the purity of the materials used in organic components.

The method described is compatible with the widely used processing of metals by vapour deposition and therefore constitutes a simplification of the production process compared with other solutions.

The proposed production of metal particle nanoclusters excels in particular compared with known methods in that even at moderate temperatures large metal particle nanoclusters are produced whose scattering cross-section for light is greater than their absorption cross-section. Thus, temperatures between about 30° C. and about 150° C. can be provided here, preferably between about 60° C. and about 140° C.

The nanoclusters on the base layer can have a reduced absorption compared with nanoclusters which would have been deposited on the underlying layer.

The nanoclusters on the base layer can have an increased near-field enhancement compared with nanoclusters which would have been deposited on the underlying layer.

The nanoclusters on the base layer can have an increased reflection or depending on the component design, also transmission compared with nanoclusters which would have been deposited on the underlying layer.

The method makes it possible to operate under very good vacuum. The production technique can be scaled to large areas and large item throughput. In one embodiment, in particular when producing the layer regions with the metal particle nanoclusters, an ultrahigh vacuum environment can be used. In this case, or in other embodiments this can be accomplished free from oxidation by a residual gas or residual gas mixture.

The method can be applied for many metals and alloys. In the case of a metal, this is preferably a pure metal, which is in particular free from metal oxide fractions.

If the surface contours produced by the metal particle nanoclusters on the base layer are only partially smoothed by the following layer in the stack, it can be the case that the metal particle nanoclusters from this subsequently applied layer project (protrude) which means that the material of the subsequent layer is substantially only applied between the metal particle nanoclusters without completely enclosing these. The latter can be used to completely smooth the surface contours with the aid of the subsequently applied layer(s).

The functional layer with metal particle nanoclusters can also be located outside the electrodes possibly in a scattering or protective layer.

The organic component can comprise a photoactive component in which one or more photoactive layers are formed in the stack of organic layers. With the aid of the base layer, a separation from the layer of the stack disposed under the base layer can be produced for the metal particle nanoclusters so that the physical properties of the metal particle nanoclusters particularly during the deposition thereof are substantially independent of the influence of the layer(s) of the layer arrangement disposed under the base layer. Conversely the base layer can also be used to protect the underlying layers from the influence of the metal clusters. A base layer can possibly prevent charge carrier or excitation recombination at the metal particle nanoclusters. The base layer can, for example consist of a metal or a metal oxide. The base layer can also be designed as multi-layer with sub-base layers.

A preferred further development provides that the arrangement of isolated metal particle nanoclusters on the base layer is produced by depositing a metal material on the base layer and the deposited metal material forms isolated nanoclusters on the base layer in a self-organizing manner. Cluster formation takes place as a result of a self-organization of the atoms previously deposited on the base layer and the diffusion thereof to crystallization nuclei. Preferably the deposited metal forms a non-closed layer on the base layer. The formation of crystallization nuclei can be accomplished for example spontaneously by the simultaneous coincidence of a sufficient number of atoms. The frequency and distribution of the crystallization nuclei can be determined by the mobility of the metal atoms at the interface with the base layer, the temperature and the input of metal atoms. The distribution can be influenced with the aid of material parameters such as the material of the base layer, type and composition of the metal and the environment—possibly solvent or vacuum from which the deposition takes place. The frequency and distribution of the crystallization nuclei can be further influenced by parameters such as pressure, temperature, deposition rate and/or deposition angle. The crystallization nuclei "collect" metal atoms in the further deposition process, which atoms are located in an environment determined by the diffusion so that no further crystallization nuclei can form in the immediate vicinity of the crystallization nuclei. Thus, a distribution of isolated nanoclusters which is advantageous for the organic components is formed. An increased process temperature promotes the diffusion of the metal atoms so that larger clusters at a greater distance from one another are formed. An increased material input promotes spontaneous cluster formation so that a higher surface density of clusters is achieved. Material input by vapour deposition from an angle results in shading of a region behind initially formed clusters. Silver forms larger clusters than copper on the materials $V_2O_5$ (vanadium (V) oxide) and $WO_3$ (tungsten oxide).

A lower vapour deposition rate in the case of $V_2O_5$ results in a surface structure having more imperfections and larger non-round clusters. The formation of crystallization nuclei can be artificially controlled by various measures. Thus, crystallization nuclei can preferably be formed at grain boundaries, roughnesses or imperfections of a base layer. The processing parameters of the base layer can be used for structuring the metal particle nanoclusters. It could thus be possibly shown that the form of the metal particle nanoclusters is influenced by the vapour deposition rate of the base layer and a more or less strong smoothing of the underlying layers, which is related to this.

It is also possible to structure the base layer possibly by ion bombardment or etching processes. In addition, the formation of crystallization nuclei can be excited by applying isolated atoms or molecules to the base layer. The growth of the metal particle nanoclusters can also be influenced by appropriate illumination.

A further development can provide that the base layer for the metal material is formed with a non-wetting surface. In the case of a non-wetting surface, the cohesion forces between the particles of the material on the surface are usually dominant compared with the adhesion forces between the material on the surface and the material from which the surface consists.

A preferred further development provides that the base layer with the metal particle nanoclusters formed thereon is formed adjacent to the electrode or counter-electrode. It can be provided that the underlying layer on which the base layer is formed is produced as a photoactive layer.

A further development can provide that an average distance between neighbouring metal particle nanoclusters is greater than a mean diameter of the metal particle nanoclusters.

A further development preferably provides that the metal particle nanoclusters on the base layer are formed with a density in the surface of about 0.1 to about 30 metal particle nanoclusters per $\mu m^2$.

In an advantageous embodiment it can be provided that the metal particle nanoclusters on the base layer are formed with a diameter of about 30 to about 300 mm. It can be provided that the metal particle nanoclusters are formed as scattering particles for light propagating in the layer arrangement.

It can be provided that the layer stack is produced at substrate temperatures in the range of 0° C. to about 180° C. Temperatures between about 30° C. and about 150° C. can be provided, preferably between about 60° C. and about 140° C. The metal particle nanoclusters can be formed here with the involvement of diffusion processes of the metal atoms on the base layer, where size and distribution of the metal particle nanoclusters can be adjusted by means of the choice of substrate temperature during this process step.

It can be provided that the base layer and the arrangement of isolated metal particle nanoclusters formed thereon are disposed outside a stack region between the electrode and the counter-electrode. Preferably the layer with the isolated metal particle nanoclusters is formed separately and spaced apart from both electrodes. The separation can be produced by means of one or more layers which are disposed between the layer with the isolated metal particle nanoclusters and the respective electrode.

It can be provided that the base layer and the arrangement of isolated metal particle nanoclusters formed thereon are disposed inside the stack region between the electrode and the counter-electrode. Preferably the layer with the isolated metal particle nanoclusters is formed separately and spaced apart from both electrodes. The separation can be produced by means of one or more layers which are disposed between the layer with the isolated metal particle nanoclusters and the respective electrode.

It can further be provided that at least one underlying layer on which the base layer and the arrangement of isolated metal particle nanoclusters are produced, is an organic layer.

Hitherto closed layers can also be tempered to form nanoclusters.

It can be provided that the base layer with the metal particle nanoclusters formed thereon forms a cover layer for the organic layers.

An advantageous embodiment provides that the base layer and the metal particle nanoclusters are introduced inside the layer stack so that the properties of the underlying layers are barely impaired by the roughness of these metal particle nanoclusters.

An advantageous embodiment provides that the layer which follows the base layer with the metal particle nanoclusters disposed thereon in the layer arrangement is produced from an organic material. It can be provided that a stack of organic layers is formed on the base layer with the metal particle nanoclusters disposed thereon.

It can be provided that the layer which follows the base layer with the metal particle nanoclusters disposed thereon in the layer arrangement is produced as a charge carrier transport layer. The charge carrier transport layer can be produced, for example, as a hole or electron transport layer. A charge transport layer in which charge carriers in the form of holes and electrons are transported can also be provided.

An advantageous embodiment provides that the base layer and the metal particle nanoclusters are introduced inside the layer stack such that the properties of the underlying layers are separated from the functional layer by a charge carrier transport layer.

An advantageous embodiment provides that the base layer and the metal particle nanoclusters are introduced inside the layer stack so that the functional layer is embedded in a charge carrier transport layer.

In an advantageous embodiment it can be provided that with the layer which follows the base layer with the metal particle nanoclusters disposed thereon, the surface contours produced by the metal particle nanoclusters are completely smoothed. For the layer following the base layer with the metal particle nanoclusters a smooth surface can thus be prepared on the side facing away from the base layer on which one or more further layers can then follow.

It can be provided to structure the layers following the functional layer by the metal particle nanoclusters, possibly in order to roughen the surface. It can be provided that the metal particle nanoclusters are used to structure other materials which preferably accumulate at the metal particle nanoclusters. It can be provided to use the metal particle nanoclusters to structure other materials which adhere poorly to the metal particle nanoclusters.

It can be provided that the metal particle nanoclusters are used to achieve the deposition of further clusters possibly by their action as catalysts or crystallization nuclei.

One embodiment can provide that the base layer is formed with a surface which is non-wetting for metals.

The recombination of charge carriers can be reduced at the metal particle nanoclusters by charge carrier transport layers. The recombination of excited states can be reduced at the metal particle nanoclusters by charge carrier transport layers.

The base layer can prevent the diffusion of metal ions into the organic layers located therebelow.

An advantageous embodiment can provide that the self-organized metal particle nanoclusters are used as crystallization nuclei for further nanostructures. The self-organized metal particle nanoclusters can be used as catalysts for the deposition of further nanostructures.

It can be provided that the base layer and the metal particle nanoclusters are introduced inside the layer stack such that the properties of the underlying layers are separated from the functional layer by a charge carrier transport layer. The base layer can be used to reduce damage to the underlying organic layers during processing of the metal. An advantageous embodiment can provide that the base layer is used to reduce a contamination of the underlying organic layers during the processing of the metal.

An advantageous embodiment can provide that the growth of the metal particle nanoclusters is controlled by heating the substrate to a temperature which does not destroy the organic layers. The heating of the substrate can be accomplished so that the metal particle nanoclusters form and separate.

An advantageous embodiment can provide that the growth of the metal particle nanoclusters is controlled by vapour deposition at low vapour deposition rates of <0.1 nm/s.

An advantageous embodiment can provide that the metal particle nanoclusters are produced on a base layer having a thickness of 1 nm to 5 nm.

An advantageous embodiment can provide that the base layer for the particle growth consists of di-vanadium-pentaoxide ($V_2O_5$) or tungsten oxide.

An advantageous embodiment can provide that the metal particle nanoclusters are made of silver, gold, copper, aluminium or mixtures thereof.

The preceding explanations on possible embodiments of the method for production apply accordingly in conjunction with the organic component.

DESCRIPTION OF EXEMPLARY EMBODIMENTS

Exemplary embodiment are explained in detail in the following with reference to figures of the drawings. In the figures:

FIG. 1 shows a schematic diagram of an organic component with a functional layer, FIG. 2 shows a graphical representation of the electroluminescence spectra of red organic light-emitting diodes FIG. 3 shows a graphical representation of the electroluminescence spectra of green organic light-emitting diodes FIG. 4 shows a graphical representation of the CIE colour value of red organic light-emitting diodes as a function of the angle of view, FIG. 5 shows a graphical representation of the CIE colour value of green organic light-emitting diodes as a function of the angle of view, FIG. 6 shows a graphical representation of the external quantum efficiency of organic light-emitting diodes as a function of the current density, FIG. 7 shows a scanning electron microscope image of the functional layer with the silver particle nanoclusters in an organic light-emitting diode, FIG. 8 shows a diagram of the height profile of the functional layer obtained by scanning force microscopy, FIG. 9 shows a graphical representation of the external quantum efficiency (in %) as a function of the wavelength of the incident light for organic solar cells, FIG. 10 shows a graphical representation of the wavelength-dependent absorption for the variously produced organic solar cells with the silver particle nanoclusters, FIG. 11 shows a scanning electron microscope image for different-sized silver particle nanoclusters and their distribution, FIG. 12 shows a scanning electron microscope image for different-sized silver particle nanoclusters and their distribution, FIG. 13 shows a scanning electron microscope image for different-sized silver particle nanoclusters and their distribution, FIG. 14 shows a scanning electron microscope image for different-sized silver particle nanoclusters and their distribution and FIG. 15 shows a scanning electron microscope image for different-sized silver particle nanoclusters and their distribution.

FIG. 1 shows a schematic view of an organic component. A layer arrangement comprises an electrode 1 which for example consists of ITO. A first charge carrier transport layer 2 is deposited on the electrode 1, which for example comprises an electron transport layer. Disposed on the first charge carrier transport layer 1 is a photoactive region 3 which is designed to be single- or multi-layer, which is followed by a base layer 4 on which metal particular nanoclusters 5 are disposed in an isolated arrangement. The base layer 4 and the metal particular nanoclusters 5, which together form a functional layer, are covered by a second charge carrier transport layer 6 which is then followed by a counter-electrode 7. The latter consists, for example, of a metal. A stack 8 of organic layers is disposed between the electrode 1 and the counter-electrode 7, in which, in the exemplary embodiment shown, the base layer 4 is embedded with the metal particular nanoclusters 5 disposed thereon. The first and the second charge carrier transport layer 2, 6 comprise, for example, an electron transport layer as well as a hole transport layer. The photoactive region 3 can be used to form the organic component as organic light-emitting diode or organic solar cell. In other embodiments (not shown), other organic layers can be formed, for example, charge carrier injection layer(s) and/or blocking layer(s).

In addition, the layer stack can be formed on a substrate 11.

In addition, the layer stack can comprise a further charge carrier transport layer 10 and optionally multi-layer layers 12 and/or 13 outside the electrode pair 1 and 7, possibly as protective layers or for coupling light in and out.

In the schematic view shown in FIG. 1, the layer following the base layer 4 completely covers a surface contour or structure formed by the metal particular nanoclusters 5 so that with the second charge carrier transport layer 6 following the base layer 4 a smooth surface 9 is produced on which the counter-electrode 9 is then deposited.

In other exemplary embodiments the base layer with the metal particular nanoclusters 5 formed thereon can be disposed at any other location in the layer arrangement.

The layer arrangement shown in FIG. 1 can be deposited on a substrate 11, for example, a glass substrate, during manufacture by means of vacuum deposition. The technology of vacuum deposition is known as such in various embodiments.

A first exemplary embodiment is described hereinafter with reference to FIGS. 2 and 4. An organic light-emitting diode was produced which emits red light "downwards" in the direction of a substrate. The organic light-emitting diode has the following layer structure:

1.1: Glass substrate (layer thickness: 1.1 mm)
1.2: ITO (90 nm)
1.3: W2(hpp)4 (1 nm)
1.4: BPhen: W2(hpp)4 (10 percent by weight (wt. %)), (73 nm)
1.5: BPhen (10 nm)

1.6: NPD: Ir(MDQ)2(acac) (10 nm), (10 wt. %)
1.7: Spiro-TAD (10 nm)
1.8: MeO-TPD: F6-TCNNQ (4 wt. %), (6 nm)
1.9: $V_2O_5$ (2 nm)
1.10: Ag particle nanocluster (3 nm—corresponding to a 3 nm thick closed layer)
1.11: MeO-TPD: F6-TCNNQ (4 wt. %), (55 nm)
1.12: F6-TCNNQ (1 nm)
1.13: Al (100 nm)

The layer 1.9 $V_2O_5$ was vapour-deposited at a vapour deposition rate of 0.2 angstrom per second and layer 1.10 Ag was vapour-deposited at a rate of 0.03 angstrom per second.

For deposition of the silver layer the substrate was heated to a temperature of 70° C.

The thickness of the silver layer relates in the following to a mass determined with a quartz oscillator and describes the thickness of a layer which would be formed in the case of a homogeneous uniform growth.

"The abbreviation wt. %" designates a mixing ratio in percent by weight during the simultaneous deposition of two substances.

The abbreviation (1:1) designates a mixing ratio of 50 wt. %.

The information in parentheses at the end of the line designates layer thicknesses.

Here the following designations are used: ITO—indium tin oxide,
W2(hpp)4-tetrakis-[1,3,4,6,7,8-hexahydro-2H-pyrimido[1,2-a]pyrimidinato] ditungsten(II),
BPhen—4,7-diphenyl-1,10-phenanthroline,
NPD—N,N'-di-[(1-naphthyl)-N,N-diphenyl]-1,1'-biphenyl)-4,4'-diamine,
Ir(MDQ)2(acac)—iridium(III)bis(2-methyldibenzo-[f,h]quinoxaline)(acetylacetonate)
Spiro-TAD—2,2',7,7'-tetrakis(N,N-diphenylamino)-9,9'-spirobifluorene,
MeO-TPD—N,N,N',N'-tetrakis(4-methoxyphenyl)benzidine,
F6-TCNNQ—2,2'-(perfluoronaphthalen-2,6-diylidene)dimalononitrile,
$V_2O_5$—vanadium(V)-oxide,
Ag—silver,
Al—aluminium The organic materials were previously purified by vacuum sublimation.

For comparison a first reference component which also comprises an organic light-emitting diode was produced as follows:
2.1: Glass substrate (1.1 mm)
2.2: ITO (90 nm)
2.3: W2(hpp)4 (1 nm)
2.4: BPhen: W2(hpp)4 (10 wt. %) (73 nm)
2.5: BPhen (10 nm)
2.6: NPD: Ir(MDQ)2(acac) (10 wt. %) (10 nm)
2.7: Spiro-TAD (10 nm)
2.8: MeO-TPD: F6-TCNNQ (4 wt. %) (1 nm)
2.9: MeO-TPD: F6-TCNNQ (4 wt. %) (65 nm)
2.10: F6-TCNNQ (1 nm)
2.11: Al (100 nm)

FIG. 2 shows a graphical representation of the wavelength-dependent spectral radiance, the electroluminescence spectrum, for the "downwards", red-light emitting organic diode and the first reference component.

Curves 20 and 21 show the wavelength-dependent electroluminescence spectra of the emission of the red organic light-emitting diodes in the case of emission perpendicular to the surface of the light-emitting diodes. The light-emitting diodes are driven with a current of 1 mA and have an area of about a 6.4 mm². The radiation density was measured perpendicular to the component surface.

The curve 21, symbolized by black-edged white squares, corresponds to the reference component without $V_2O_5$ and without metal particle nanoclusters.

The curves 20 symbolized by black circles correspond to the component with a V2O5 base layer and metal particle nanoclusters of silver.

FIG. 4 shows a graphical representation of the CIE value (according to the CIE standard colour system of the International Commission on Illumination) as a function of the angle for the red organic light-emitting diode and the first reference component. The curves 40 (circular symbols) relate to the red organic light-emitting diode with functional layer and metal particle nanoclusters. Curve 41 (square symbols) relates to the first reference component. A very good angular stability is obtained for the red organic light-emitting diode with functional layer and metal particle nanoclusters.

With reference to FIGS. 3 and 5, a further exemplary embodiment is explained hereinafter. An organic light-emitting diode was produced which emits green light "downwards" in the direction of the substrate. Here the following layer structure was selected:
3.1 Glass substrate (1.1 mm)
3.2 ITO (90 nm)
3.3 W2(hpp)4 (1 nm)
3.4 BPhen: W2(hpp)4 (10 wt. %) (51 nm)
3.5 BPhen (10 nm)
3.6 TCTA: Ir(ppy)3 (8 wt. %) (10 nm)
3.7 Spiro-TAD (10 nm)
3.8 MeO-TPD: F6-TCNNQ (4 wt. %) (1 nm)
3.9 $V_2O_5$ (2 nm)
3.10 Ag particle nanocluster (3 nm, corresponding to a 3 nm thick closed layer)
3.11 MeO-TPD: F6-TCNNQ (4 wt. %) (44 nm)
3.12 F6-TCNNQ (1 nm)
3.13 Al (100 nm)

The layer 3.9 $V_2O_5$ was vapour deposited at a rate of 0.2 angstrom per second. The silver layer 3.10 was deposited at a rate of 0.03 angstrom per second at a substrate temperature of 70° C.

Herein the following designation is used: TCTA—4,4',4"-tris(N-carbazolyl)triphenylamine and Ir(ppy)3—fac-tris(2-phenylpyridine)iridium. The layer 3.9 $V_2O_5$ was vapour deposited at a vapour deposition rate of 0.2 angstrom per second and layer 3.10 Ag at a rate of 0.03 angstrom per second. For the deposition of the silver layer the substrate was heated to a temperature of 70° C.

For this purpose a reference component having the following layer stack was fabricated which also constitutes a "downward" green-light emitting organic diode: glass substrate (1.1 nm)/ITO (90 nm)/W2(hpp)4 (1 nm)/BPhen: W2(hpp)4 (10 wt. %) (51 nm)/BPhen (10 nm)/TCTA: Ir(ppy)3 (8 wt. %) (10 nm)/Spiro-TAD (10 nm)/MeO-TPD: F6-TCNNQ (4 wt. %) (49 nm)/F6-TCNNQ (1 nm)/Al (100 nm)

Figure 1:
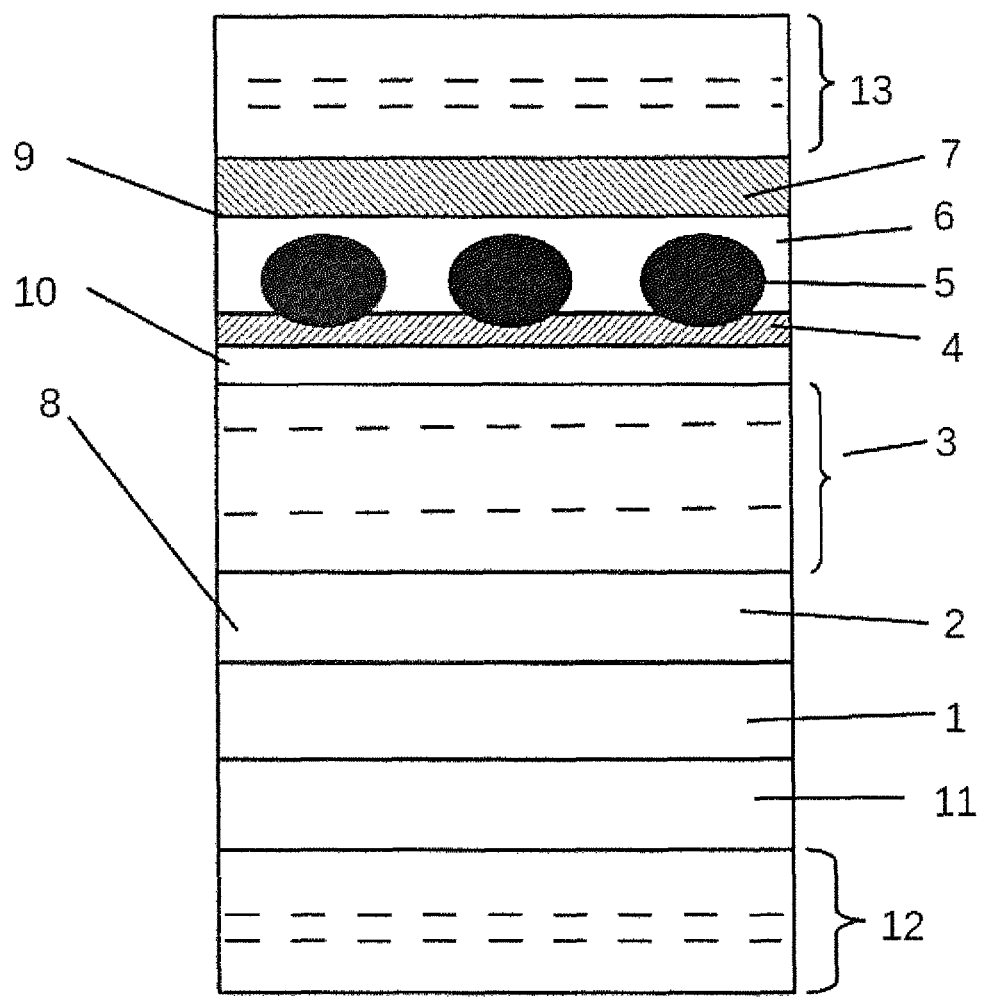
Figure 2:
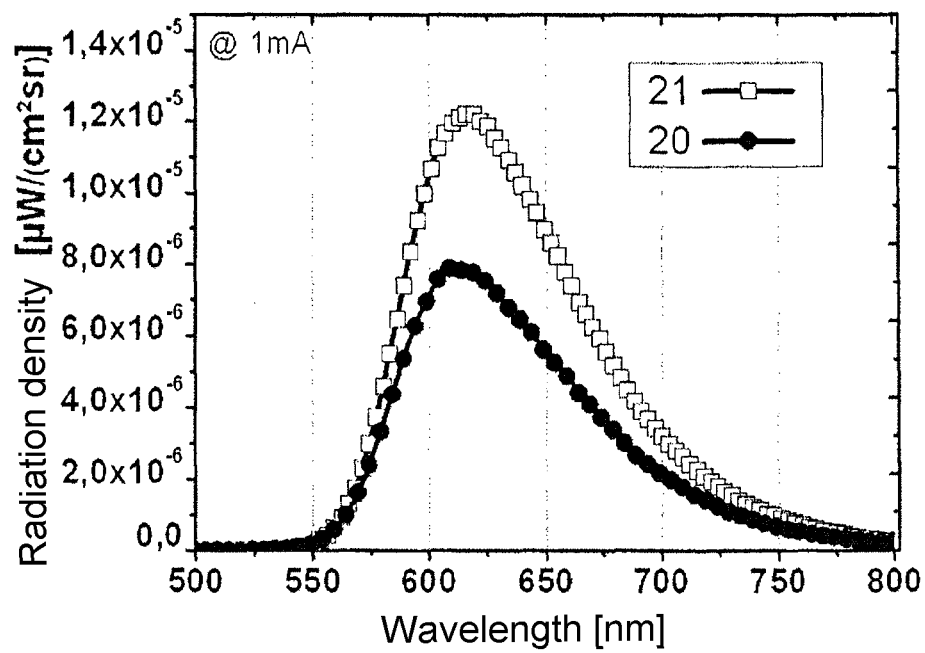
Figure 3:
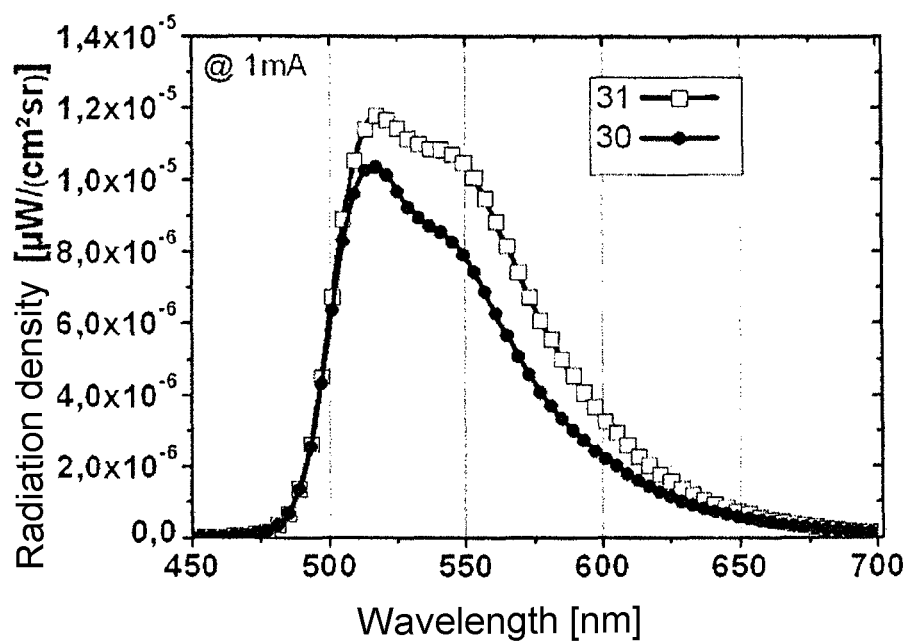
FIG. 3 shows the radiation density as a function of the wavelength, the electroluminescence spectrum at a current of 1 mA and a component area of 6.4 mm². The radiation density was measured perpendicular to the component surface.
Figure 4:
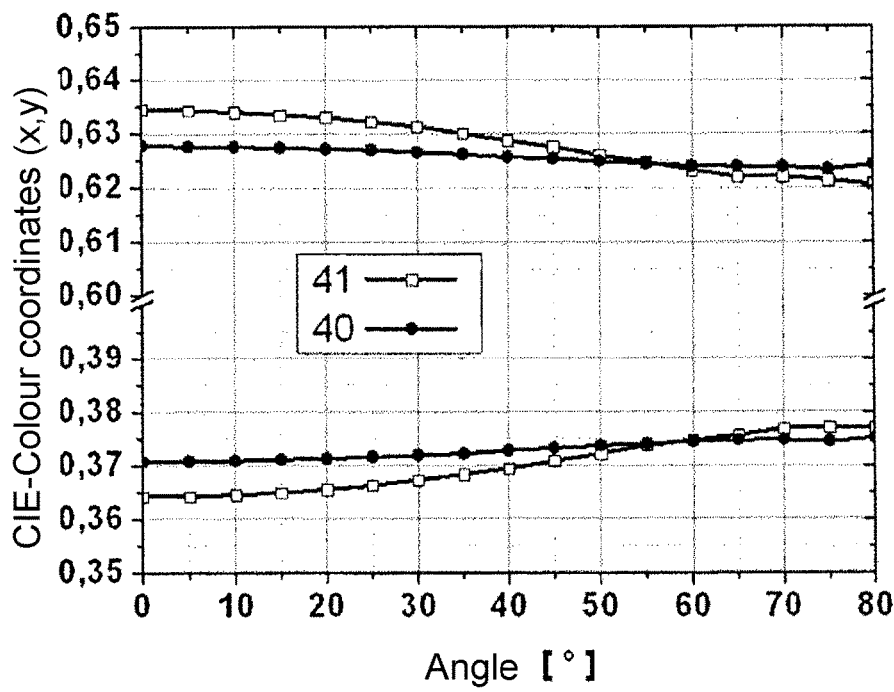
Figure 5:
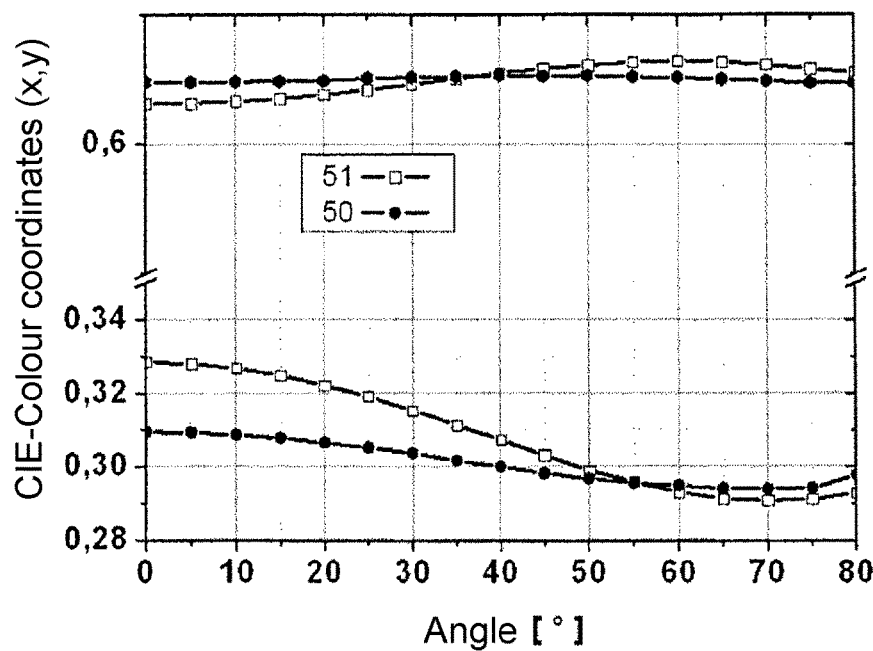
FIG. 5 shows the CIE value as a function of the angle of view.

In FIG. 3 curve 30 symbolized by black circles relates to the green organic light-emitting diode with functional layer and metal particle nanoclusters. The curves 31 symbolized by black-edged white squares relates to a reference component without the functional layer with the metal particle nanoclusters. In FIG. 5 the curves 50 show the result for the green organic light-emitting diode with functional layer and metal particle nanoclusters. The curves 51 relate to the reference component.

Figure 7:
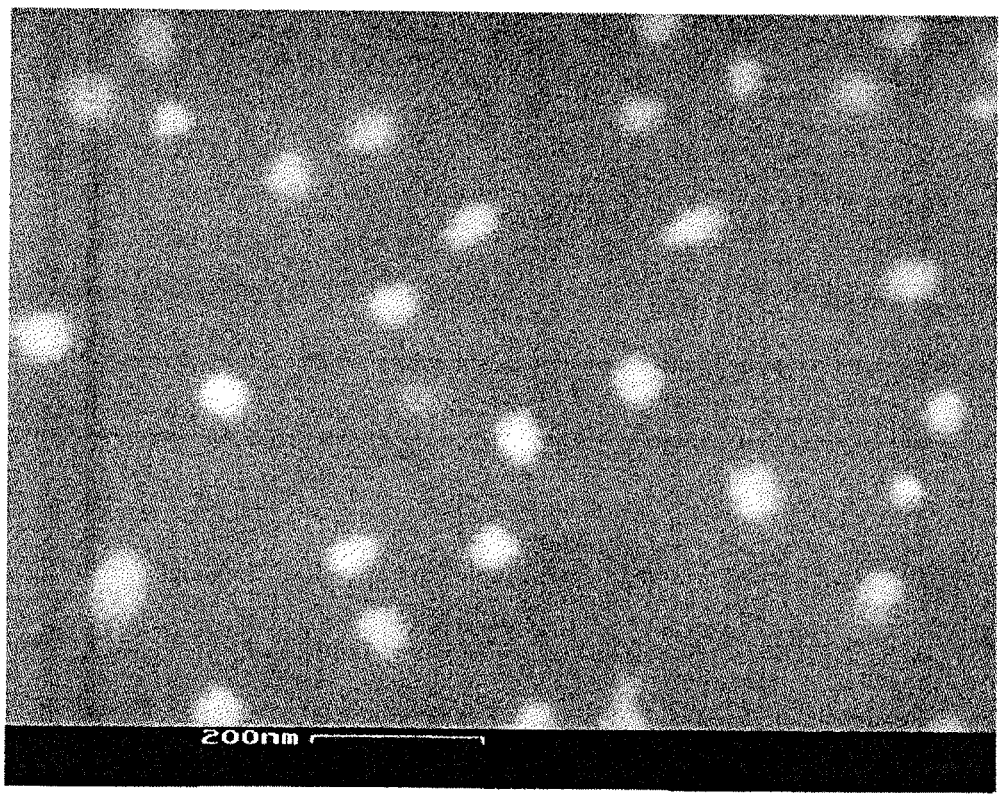

FIG. 7 shows a diagram recorded by means of scanning electron microscopy of a functional layer in which after deposition of silver particles on a base layer of $V_2O_5$, silver particle nanoclusters were formed. The stack substantially corresponds to the arrangement with the layers 3.1 to 3.13 with two deviations and also has the function of a green organic light-emitting diode. The layer 3.7b was made of Spiro-TAD with a thickness of 3 nm and the scanning electron micrograph was taken in a region of the sample on which no aluminium 3.13b was deposited. The recording was made by means of a secondary electron detector and a scanned focussed electron beam where the layer stack is projected perpendicular to the layer planes. Regions which appear bright contain a large amount of silver. It can be clearly identified that the silver has congregated to form metal particle nanoclusters which are spaced apart. A general blurring of the diagram arises because the functional layer of metal particle nanoclusters is covered with further organic layers.

A further exemplary embodiment is explained hereinafter with reference to FIGS. 6 and 8. An "upwards" light-emitting organic diode was produced as follows:
4.1 Substrate
4.2 Al (40 nm)
4.3 Ag (40 nm)
4.4 MeO-TPD: F6-TCNNQ (4 wt %) (36 nm)
4.5 NPD (10 nm)
4.6 NPD: Ir(MDQ)2(acac) (10 wt. %) (20 nm)
4.7 BPhen (10 nm)
4.8 BPhen: Cs (64 nm)
4.9 Ag (21 nm)
4.10 $V_2O_5$ (2 nm)
4.11 Ag particle nanocluster (3 nm)
4.12 NPD (77 nm)

For comparison another reference component was produced as follows:
5.1 Substrate
5.2 Al (40 nm)
5.3 Ag (40 nm)
5.4 MeO-TPD: F6-TCNNQ (4 wt. %) (36 nm)
5.5 NPD (10 nm)
5.6 NPD: Ir(MDQ)2(acac) (10 wt. %) (20 nm)
5.7 BPhen (10 nm)
5.8 BPhen: Cs (64 nm)
5.9 Ag (21 nm)
5.10 NPD (82 nm)

Figure 6:
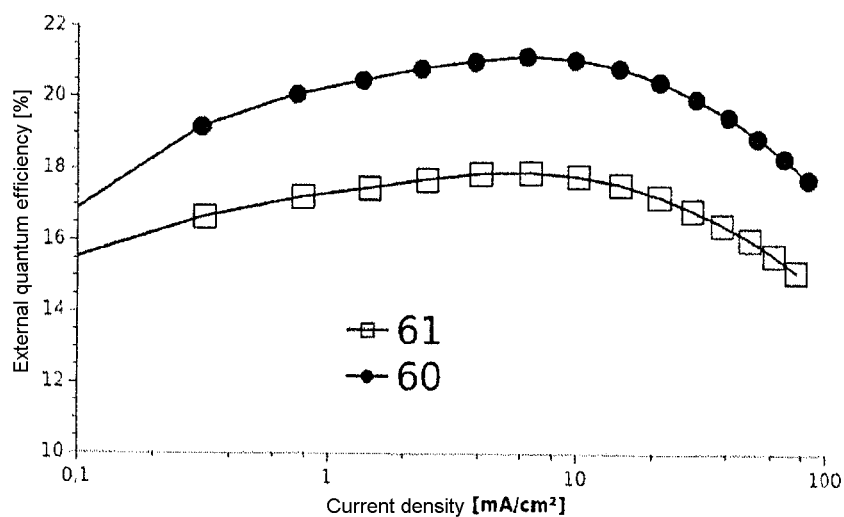

FIG. 6 shows a graphical representation of the external quantum efficiency (in %) as a function of the current density for the "upwards" emitting organic light-emitting diodes. In order to determine the external or outer quantum efficiency, a goniometer was used to take into account the angle-dependent emission behaviour. The curve 61, symbolized by black-edged white squares relates to the further reference component. The curves 60 were measured for the organic light-emitting diode with functional layer and metal particle nanoclusters.

Figure 8:
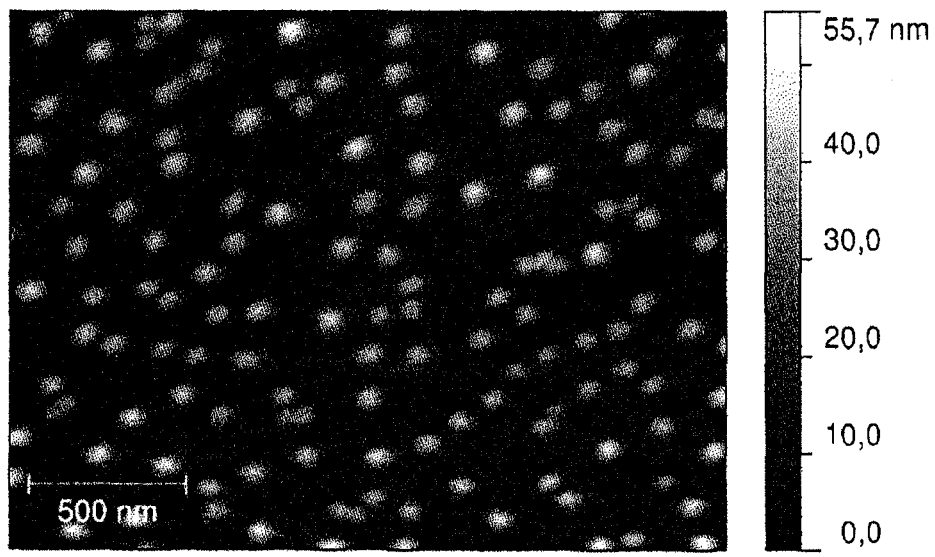

FIG. 8 shows a diagram of the height profile obtained by scanning electron microscopy for a layer stack with the layers 4.1 to 4.11 (without layer 4.12).

Furthermore, organic solar cells were produced as follows.

Solar Cell

Example 1

6.1 Glass substrate (1.1 nm)
6.2 ITO (90 nm)
6.3 W2(hpp)4 (1 nm)
6.4 C60 (5 nm)
6.5 ZnPc: C60 (1:1) (20 nm)
6.6 ZnPc (3 nm)
6.7 F-DPB: F6-TCNNQ (10 wt. %) (2 nm)
6.8 $V_2O_5$ (2 nm)
6.9 Ag particle nanocluster (3 nm)
6.10 BF-DPB: F6-TCNNQ (10 wt. %) (55 nm)
6.11 F6-TCNNQ (1 nm)
6.12 Al (100 nm)

Solar Cell

Example 2

7.1 Glass substrate (1.1 nm)
7.2 ITO (90 nm)
7.3 W2(hpp)4 (1 nm)
7.4 C60 (30 nm)
7.5 ZnPc: C60 (1:1) (40 nm)
7.6 ZnPc (3 nm)
7.7 F-DPB: F6-TCNNQ (10 wt. %) (2 nm)
7.8 $V_2O_5$ (2 nm)
7.9 Ag nanoparticle: Ag (3 nm)
7.10 BF-DPB: F6-TCNNQ (7 wt. %) (55 nm)
7.11 F6-TCNNQ (1 nm)
7.12 Al (100 nm)

The layers 7.8 $V_2O_5$ and 6.8 $V_2O_5$ were vapour-deposited at a rate of 0.2 angstrom per second. The silver layers 6.9 and 6.8 were vapour deposited at a rate of 0.03 angstrom per second at a substrate temperature of 80° C.

Solar Cell

Example 3

8.1 Glass substrate (1.1 nm)
8.2 ITO (90 nm)
8.3 W2(hpp)4 (1 nm)
8.4 C60 (30 nm)
8.5 ZnPc: C60 (1:1) (40 nm)
8.6 ZnPc (3 nm)
8.7 F-DPB: F6-TCNNQ (10 wt. %) (2 nm)
8.8 $V_2O_5$ (2 nm)
8.9 BF-DPB: F6-TCNNQ (7 wt. %) (55 nm)
8.10 F6-TCNNQ (1 nm)
8.11 Al (100 nm)

Here the following designations are used: C60—fullerene—C60, ZnPc—zinc(II)-phthalocyanine and BF-DPB—N,N'-((diphenyl-N,N'-bis)9,9,-dimethyl-fluoren-2-yl)-benzidine).

Whereas the first two organic solar cells according to Examples 1 and 2 have a functional layer with metal particle nanoclusters (silver particles), this is not the case for the last-mentioned organic solar cell according to the example. The following Table 1 shows the parameters measured for the three organic solar cells

TABLE 1

|  | Example 3 | Example 2 | Example 1 |
| --- | --- | --- | --- |
| Short circuit current density | 9.36 mA/cm$^2$ | 10.62 mA/cm$^2$ | 9.49 mA/cm$^2$ |
| Fill factor | 50.9% | 49.1% | 55.9% |
| Voltage | 0.51 V | 0.50 V | 0.50 V |
| Efficiency | 2.45% | 2.61% | 2.67% |

Figure 9:
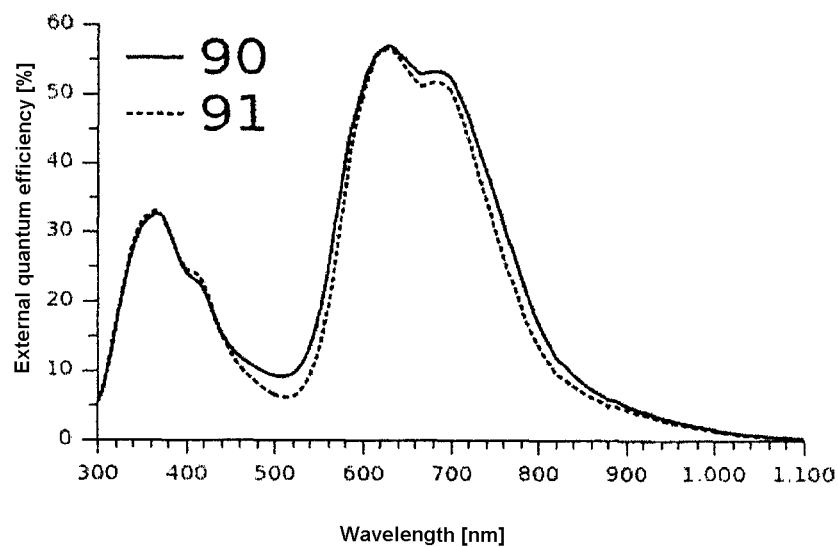

FIG. 9 shows wavelength-dependent external quantum efficiencies of the solar cells according to the layer stack according to Example 2 and Example 3 in the case of a short circuit. The continuous line 90 corresponds to Example 2 with functional layer and metal particle nanoclusters. The dashed curve 91 corresponds to the reference component Example 3. By introducing a functional layer with metal particle nanoclusters, an increased quantum efficiency is obtained for a wide range of wavelengths.

The functional layer with metal particle nanoclusters can also be used to produce efficient components with thin active layers as in Example 1.

Investigations were then carried out on the process of self-organizing cluster formation of the metal particles deposited on the respective base layer. For this purpose, layer stacks 9a to 9i are shown which substantially correspond to that of an organic solar cell:

9.1 Glass (1.1 mm)
9.2 ITO (90 nm)
9.3 W2(hpp)4 (1 nm)
9.4 C60: W2(hpp)4 (2 wt. %) (10 nm)
9.5 C60 (30 nm)
9.6 ZnPc: C60 (1:1) (30 nm)
9.7 ZnPc (5 nm)
9.8 BF-DPB: F6-TCNNQ (10 wt. %) (21 nm a, b, c, d) (0 nm e, f, g, h, i)
9.9 V$_2$O$_5$ (2 nm a, e, f) (4 nm b, c, d, h, i)
9.10 Ag (10 nm d, i) (5 nm c, h) (3 nm a, b, f, g) (0 nm e)
9.11 BF-DPB: F6-TCNNQ (10 wt. %) (48 nm e) (45 nm f) (43 nm g) (41 nm h) (36 nm i) (9 nm a) (7 nm b) (5 nm c) (0 nm d)
9.12 F6-TCNNQ (1 nm e, f, g, h, i) (0 nm a, b, c, d)
9.13 Al (100 nm e, f, g, h, i) (0 nm a, b, c, d)

The base layer was produced by means of vacuum deposition at a rate of 0.2 angstrom per second from vanadium oxide (V$_2$O$_5$). Silver particles were then deposited thereon by means of vacuum deposition at a rate of 0.03 angstrom per second. The substrate was heated to 80° C. for this.

Table 2 shows the results obtained for different layer thicknesses with which the silver was deposited on the underlying base layer of V$_2$O$_5$.

TABLE 2

| Layer stack | Layer thickness | Cluster diameter | Cluster height | Aspect ratio | Cluster density per area |
| --- | --- | --- | --- | --- | --- |
| 9d | 10 nm | 138 nm | 57 nm | 0.41 | 19/um$^2$ |
| 9c | 5 nm | 113 nm | 50 nm | 0.44 | 12/um$^2$ |
| 9b | 3 nm | 100 nm | 40 nm | 0.40 | 12/um$^2$ |
| 9a | 3 nm | 87 nm | 33 nm | 0.38 | 19/um$^2$ |

Figure 10:
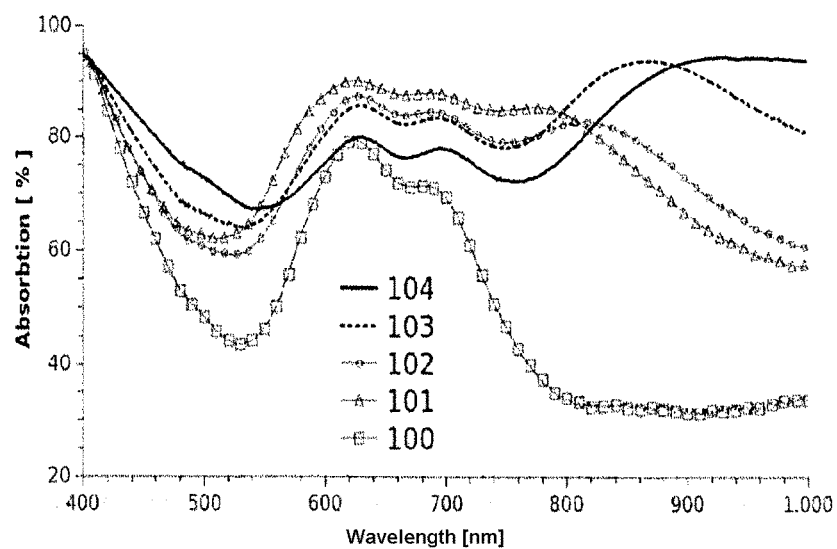

FIG. 10 shows a graphical representation of the wavelength-dependent absorption for the various layer stacks produced 9f to 9i with the silver particle nanoclusters as well as the reference component 9e. The absorption was determined from the direct reflection of the component with a reflective back contact. Curve 100 shows a reference curve suitable for the layer stack 9e for a solar cell without a functional layer with silver particle nanoclusters. Curve 101 shows the absorption behaviour for the layer arrangement in which the silver particle nanoclusters are formed with a quantity of silver corresponding to a height of about 3 nm and on a base layer of V$_2$O$_5$ having a thickness of 2 nm corresponding to the layer stack 9f. The curves 102, corresponding to 9g, 103 corresponding to 9h and 104 corresponding to 9i then relate to embodiments in which the quantity of silver has a height of about 3 nm or 5 nm as well as 10 nm and are formed on a base layer having a thickness of 4 nm.

Figure 11:
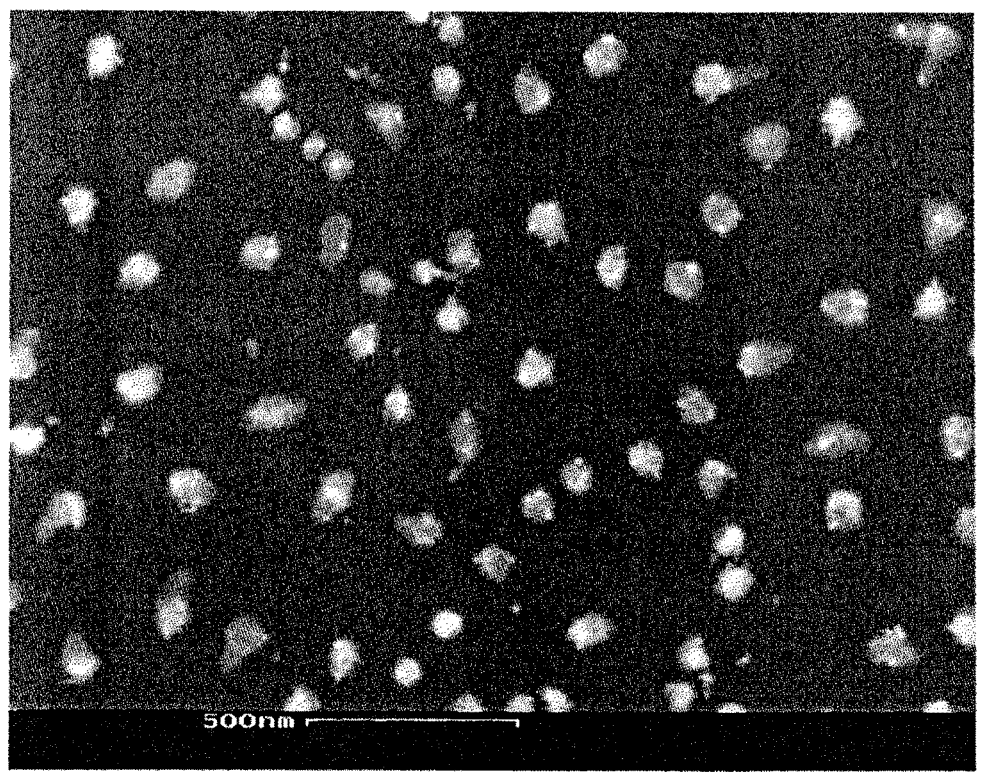
Figure 12:
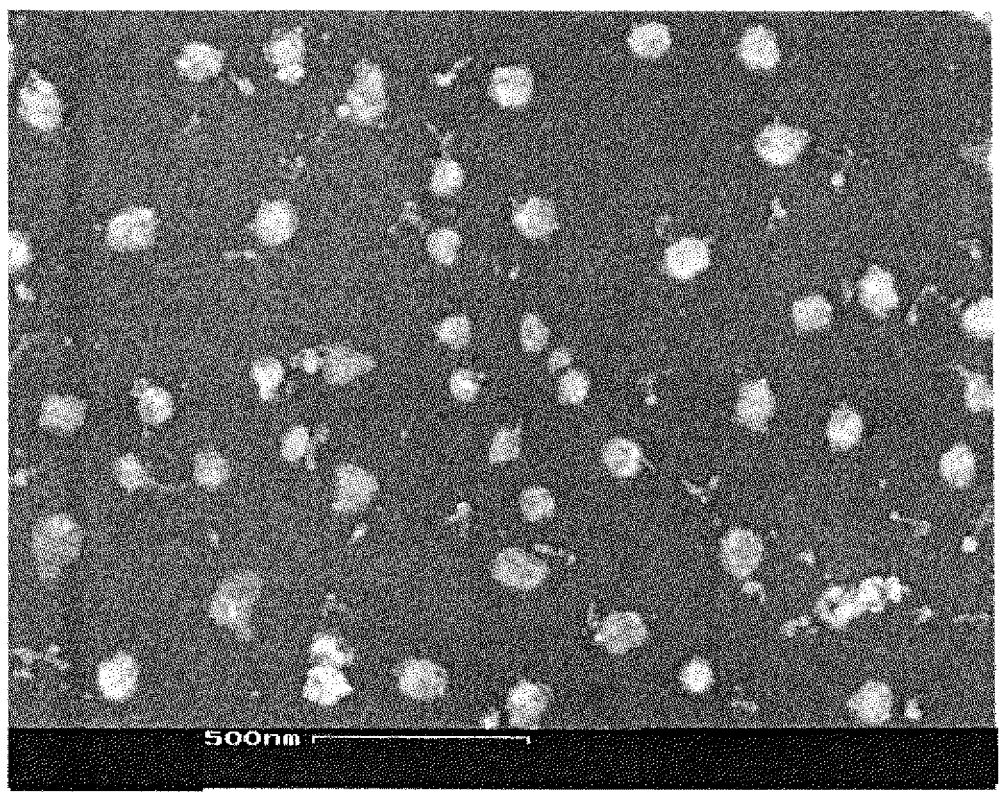
Figure 13:
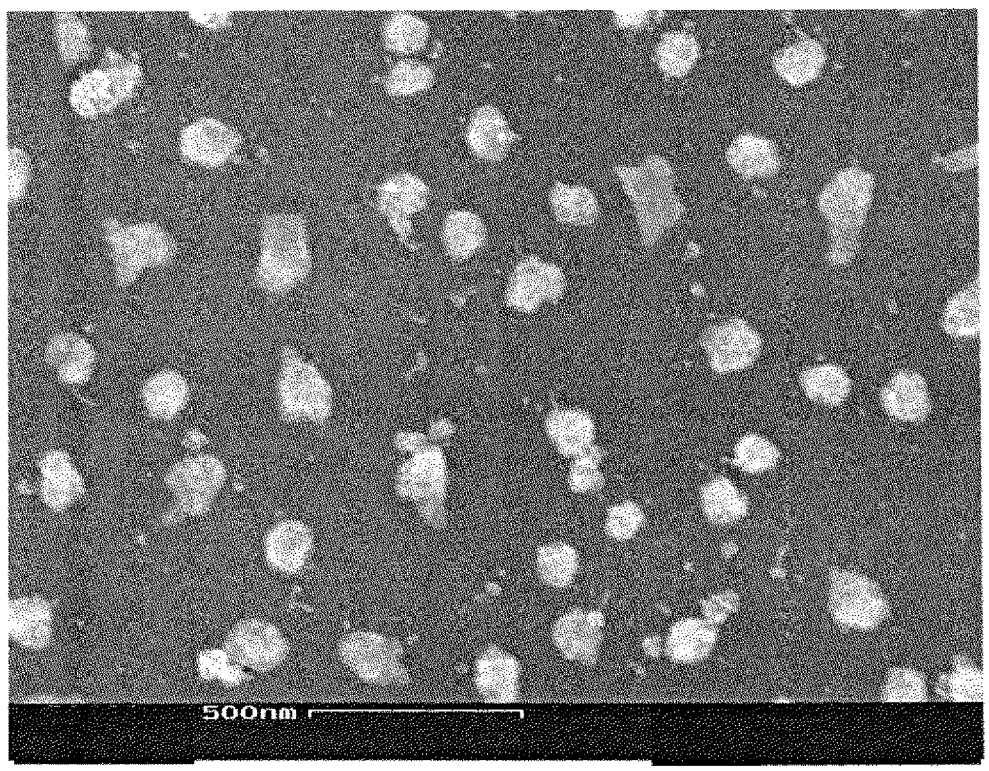

FIG. 11 shows a scanning electron microscope image of silver particle nanoclusters and their distribution for the layer stack 9a. FIG. 12 shows a scanning electron microscope image of silver particle nanoclusters and their distribution for the layer stack 9b. FIG. 13 shows an image recording by means of a scanning electron microscope of silver particle nanoclusters and their distribution for the layer stack 9c. FIG. 13 shows an image recording by means of a scanning electron microscope of silver particle nanoclusters and their distribution for the layer stack 9d.

FIGS. 7 and 8 and also 11 to 15 contain a white calibration bar with length information and enable a comparison of sizes.

According to FIG. 10 it is found that the absorption can be increased in a large wavelength range by the functional layer. In addition, size and distribution of the metal particle nanoclusters depend on the thickness of the base layer. The regions of additional absorption are shifted with larger quantities of silver according to FIG. 10 and cluster diameters according to Table 2 to larger wavelengths.

Figure 14:
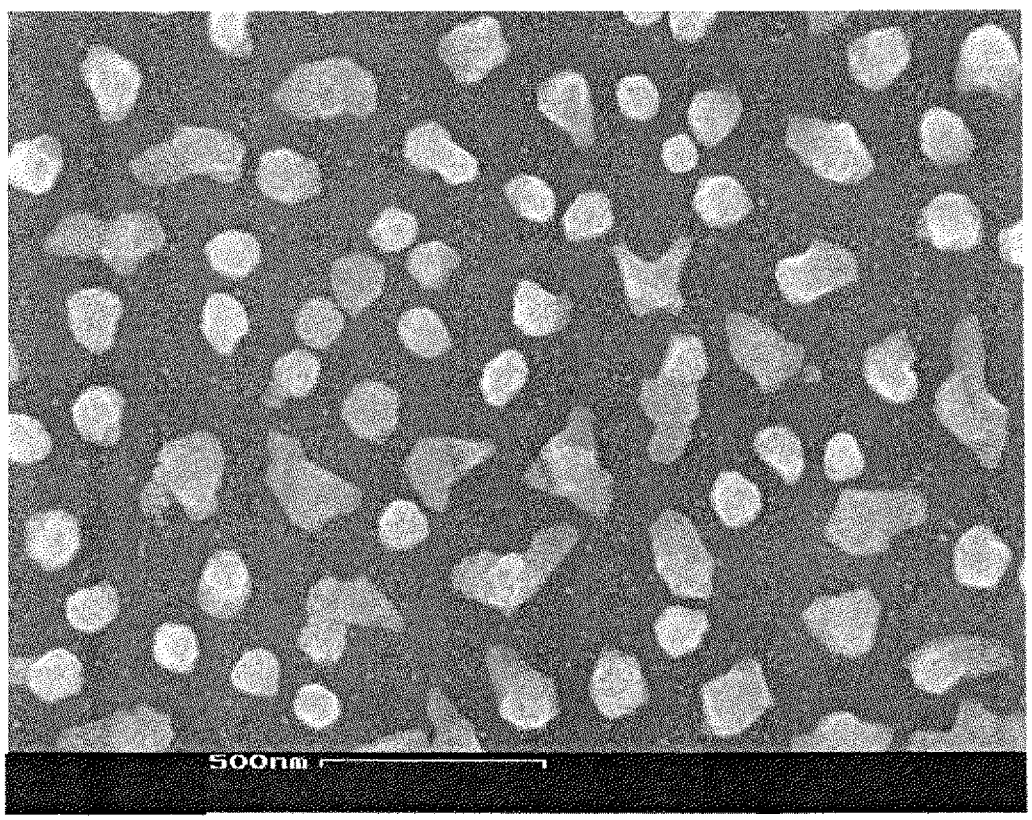

The metal particle nanoclusters from FIG. 14 (layer stack 9d) show crystalline regions.

The following layer stack was investigated in order to study the influences of the homogeneity of the base layer:

10.1 Glass (1.1 mm)
10.2 ITO (90 nm)
10.3 BPhen: Cs (1:1) (25 nm)
10.4 BPhen (10 nm)
10.5 TCTA: Ir(ppy)3 (8 wt. %) (20 nm)
10.6 Spiro-TAD (10 nm)
10.7 MeO-TPD: F6-TCNNQ (4 wt. %) (30 nm)
10.8 V$_2$O$_5$ (2 nm)
10.9 Ag (4 nm)
10.10 MeO-TPD: F6-TCNNQ (39 nm)
10.11 V205 (1 nm)

The layer 10.8 of V$_2$O$_5$ was vapour-deposited at a lower rate of 0.1 angstrom per second, the layer 10.9 of silver was vapour-deposited at a rate of 0.03 angstrom per second at a substrate temperature of 70° C.

Figure 15:
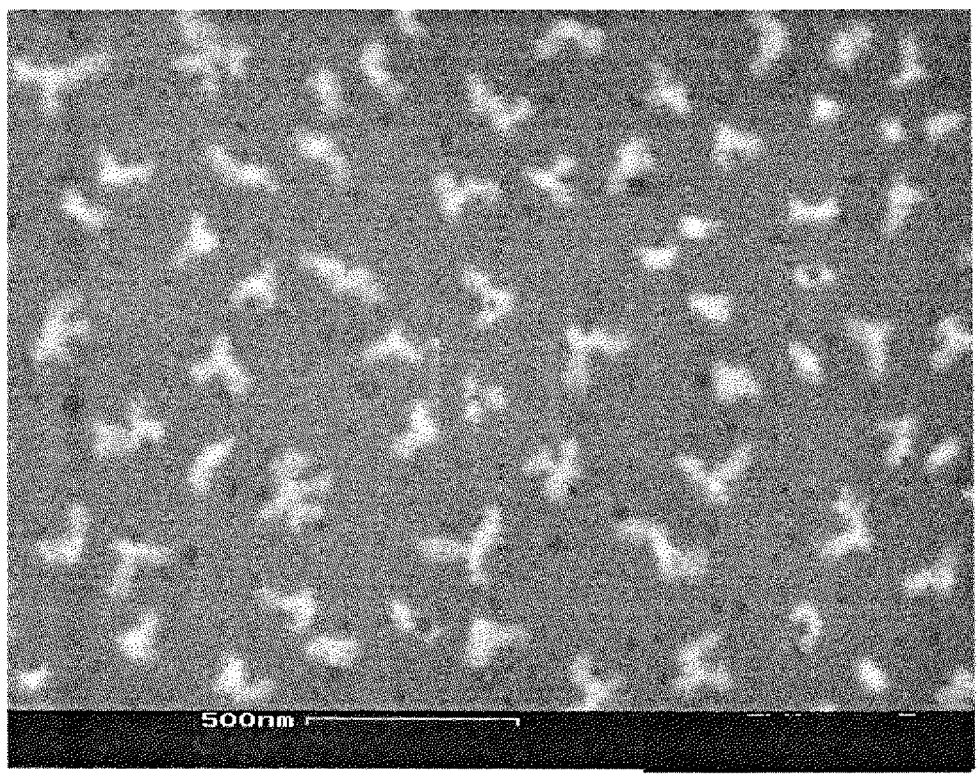

FIG. 15 shows a scanning electron microscope image of this layer stack. As a result of the low vapour deposition rate of the base layer it is not so homogeneous. Light silver structures which are not elliptical and dark defects can be seen in the base layer. The structure of the base layer can be used to control the growth of the metal particle nanoclusters.

The features of the invention disclosed in the preceding description, the claims and the drawings can be important both individually and in any combination for the implementation of the invention in its various embodiments.

The invention claimed is:

1. A method for producing an organic component comprising a layer stack that comprises an electrode, a counter-electrode, and one or more organic layers, the method comprising:

arranging a base layer of an inorganic material on a region of the layer stack, the region comprising at least one organic layer of the one or more organic layers;

forming an arrangement of isolated metal particle nanoclusters on the base layer to produce a functional layer comprising the base layer and the arrangement of isolated metal particle nanoclusters.

2. The method according to claim 1, wherein forming the arrangement of isolated metal particle nanoclusters comprises depositing on the base layer a metal material that forms the isolated metal particle nanoclusters in a self-organizing manner.

3. The method according to claim 2, wherein the base layer comprises a non-wetting surface onto which the metal material is deposited.

4. The method according to claim 1, wherein an organic material is arranged on a side of the functional layer that is opposite the region of the layer stack.

5. The method according to claim 1, wherein the functional layer is adjacent to and in contact with a charge carrier transport layer.

6. The method according to claim 1, wherein an average distance between the metal particle nanoclusters is greater than a mean diameter of the metal particle nanoclusters.

7. The method according to claim 1, wherein a density of metal particle nanoclusters on the base layer is from about 0.1 to about 30 metal particle nanoclusters per $\mu m^2$.

8. The method according to claim 1, wherein the metal particle nanoclusters have a diameter of from about 30 nm to about 300 nm.

9. The method according to claim 1, wherein the method further comprises forming the layer stack at substrate temperatures in the range of 0° C. to about 180° C.

10. The method according to claim 1, wherein the functional layer is arranged outside a stack region between the electrode and the counter-electrode.

11. The method according to claim 10, wherein the base layer and the arrangement of isolated metal particle nanoclusters are produced on an organic layer.

12. The method according to claim 1, wherein the functional layer is arranged between the electrode and the counter-electrode.

13. An organic component produced according to the method according to claim 1, the organic component comprising a layer stack, the layer stack comprising an electrode, a counter-electrode, one or more organic layers, and a functional layer comprising metal particle nanoclusters disposed on a base layer.

* * * * *

UNITED STATES PATENT AND TRADEMARK OFFICE
CERTIFICATE OF CORRECTION

PATENT NO. : 9,595,692 B2
APPLICATION NO. : 14/652188
DATED : March 14, 2017
INVENTOR(S) : Till Jaegeler-Hoheisel et al.

It is certified that error appears in the above-identified patent and that said Letters Patent is hereby corrected as shown below:

At Column 15, Line 3, after "layers;" insert --and--.

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*